(12) United States Patent
Cho et al.

(10) Patent No.: US 7,829,890 B2
(45) Date of Patent: Nov. 9, 2010

(54) ORGANIC LIGHT EMITTING DISPLAY DEVICE AND METHOD OF FABRICATING THE SAME

(75) Inventors: Yu-Sung Cho, Jeonnam (KR); Ho-Jin Kang, Suwon-si (KR); Myung-Ho Oh, Daegu-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 911 days.

(21) Appl. No.: 11/209,839

(22) Filed: Aug. 24, 2005

(65) Prior Publication Data

US 2006/0060865 A1   Mar. 23, 2006

(30) Foreign Application Priority Data

Aug. 25, 2004   (KR) ................. 10-2004-0067286

(51) Int. Cl.
G02F 1/136 (2006.01)
(52) U.S. Cl. .......................................... 257/59; 257/72
(58) Field of Classification Search .................. 257/59, 257/72
See application file for complete search history.

(56) References Cited

U.S. PATENT DOCUMENTS

| | | | |
|---|---|---|---|
| 2002/0074936 A1 | 6/2002 | Yamazaki | |
| 2003/0197178 A1 * | 10/2003 | Yamazaki et al. | 257/59 |
| 2004/0242111 A1 | 12/2004 | Morii | |
| 2005/0046342 A1 | 3/2005 | Park | |
| 2006/0060838 A1 | 3/2006 | Kang | |

FOREIGN PATENT DOCUMENTS

| | | |
|---|---|---|
| JP | 2000-173780 | 6/2000 |
| KR | 10-2004-0035083 | 4/2004 |
| KR | 1020040037663 A1 | 5/2004 |
| KR | 1020040037663 * | 7/2004 |

OTHER PUBLICATIONS

Non-Final Office Action issued Jan. 2, 2008 in U.S. Appl. No. 11/020,658.
Non-Final Office Action issued Jun. 17, 2008 in U.S. Appl. No. 11/020,658.
Non-Final Office Action issued Oct. 3, 2008 in U.S. Appl. No. 11/020,658.
Non-Final Office Action issued Apr. 7, 2009 in U.S. Appl. No. 11/020,658.
Non-Final Office Action issued Nov. 4, 2009 in U.S. Appl. No. 11/020,658.

* cited by examiner

Primary Examiner—Long Pham
(74) Attorney, Agent, or Firm—H.C. Park & Associates, PLC

(57) ABSTRACT

An organic light emitting display device and a method of fabricating the same are provided. The organic light emitting display device includes a substrate, a first electrode formed on the substrate, an inorganic pixel defining layer formed on the first electrode and having an opening exposing at least a portion of the first electrode, an organic layer disposed on the first electrode and having at least an organic emission layer, and a second electrode formed on the organic layer.

7 Claims, 1 Drawing Sheet

ORGANIC LIGHT EMITTING DISPLAY DEVICE AND METHOD OF FABRICATING THE SAME

CROSS-REFERENCE TO RELATED APPLICATION

This application claims priority to and the benefit of Korean Patent Application No. 10-2004-0067286, filed Aug. 25, 2004, which is hereby incorporated by reference for all purposes as if fully set forth herein.

BACKGROUND OF THE INVENTION

1. Field of the Invention

The present invention relates to an organic light emitting display device (OLED) and a method of fabricating the same and, more particularly, to an organic light emitting display device including an inorganic pixel defining layer that prevents outgas from the pixel defining layer from deteriorating an organic emission layer.

2. Discussion of the Background

Generally, an OLED is an emissive flat panel display device that electrically excites an organic compound to emit light. Hence, the OLED does not require a backlight unit, unlike a liquid crystal display (LCD). Therefore, the OLED may be made lightweight and thin using simplified processes. Also, the OLED may be fabricated at a low temperature, and it has a fast response speed of less than 1 ms, low power consumption, wide viewing angle, and high contrast. Accordingly, the OLED is attracting public attention as a next generation flat panel display device.

Generally, the OLED includes an organic emission layer between an anode and a cathode so that a hole supplied from the anode and an electron supplied from the cathode combine in the organic emission layer to form an exciton as a hole-electron pair, and the exciton returns to a ground state to generate energy, thereby emitting light.

An OLED may be a passive matrix or an active matrix OLED depending on how N×M pixels, disposed in a matrix, are driven. The passive matrix OLED has simpler manufacturing processes since its display region includes simple matrix type devices made of anodes and cathodes. However, its application may be limited to low resolution and small screen display devices due to problems of low resolution, high driving voltage, and reduced lifetime of the organic material. On the contrary, the active matrix OLED may be used for high resolution, large screen display devices since its display region includes thin film transistors formed in every pixel to supply a uniform current to the respective pixels to thereby obtain satisfactory brightness and low power consumption.

FIG. 1 is a cross-sectional view showing a pixel of a conventional OLED and a method of fabricating the same.

Referring to FIG. 1, a first electrode 110 is patterned and formed on a transparent substrate 100, which may be made of glass or plastic. When the first electrode 110 is an anode, it may be a transparent electrode made of indium tin oxide (ITO) or indium zinc oxide (IZO) having a high work function, or it may be a reflective electrode including a reflective layer made of a highly reflective metal such as Al, an Al alloy, or the like as its lower layer. When formed as a cathode, the first electrode 110 may be formed of a thin transparent electrode made of one material selected from a group consisting of Mg, Ca, Al, Ag, and an alloy thereof as a conductive metal having a low work function, or it may be a thick reflective electrode.

A pixel defining layer 120, which defines a pixel region, is formed of an insulating material on the first electrode 110 in order to insulate an organic emission layer. Typically, the pixel defining layer 120 is formed of an organic material such as polyimide (PI), polyamide (PA), acryl resin, benzocyclobutene (BCB), and phenol resin.

The pixel defining layer 120 may be deposited on the substrate using a spin coating method. Referring to FIG. 1, the pixel defining layer 120 has a thickness d of about 1 μm to 2 μm.

An opening 115 is formed in the pixel defining layer 120 to expose a portion of a surface of the first electrode 110 using a dry etching process.

Then, an organic layer 130, including at least an organic emission layer, is formed on the pixel defining layer 120 and on the exposed first electrode 110. The organic layer 130 may further include at least one of a hole injection layer, a hole transport layer, a hole blocking layer, an electron transport layer, and an electron injection layer in addition to the organic emission layer. The organic emission layer may be made of a low molecular weight material such as, for example, aluminum-tris-quinolate (Alq3), anthracene, and cyclo pentadiene, or a polymer material such as, for example, poly-(p-phenylenevinylene) (PPV) and its derivatives, polythiophene and its derivatives, and polyphenylene (PPP). The organic layer may be formed by a spin coating method and then patterned.

A second electrode 140 is formed on the entire surface of the organic layer 130. The second electrode 140 may be a reflective electrode made of one selected from a group consisting of Mg, Ca, Al, Ag and an alloy thereof, as a conductive metal having a low work function, when the first electrode 110 is a transparent anode or a transparent electrode including a reflective layer, and may be formed of a transparent electrode such as ITO or IZO when the first electrode 110 is a cathode. The second electrode 140 may be formed by a vacuum deposition method.

However, when the pixel defining layer 120 is formed of an organic material, outgassing of $H_2O$, $O_2$ and so on from the pixel defining layer into the organic layer 130 may deteriorate the organic layer 130, thereby increasing pixel shrinkage and decreasing the OLED's lifetime.

SUMMARY OF THE INVENTION

The present invention provides an organic light emitting display device including an inorganic pixel defining layer and a method of fabricating the same, in which it is possible to reduce pixel shrinkage and increase the lifetime of an organic emission layer.

Additional features of the invention will be set forth in the description which to follows, and in part will be apparent from the description, or may be learned by practice of the invention.

The present invention discloses an organic light emitting display device including a substrate, a first electrode formed on the substrate, an inorganic pixel defining layer formed on the first electrode and having an opening for exposing at least a portion of the first electrode, an organic layer disposed on the first electrode and having at least an organic emission layer, and a second electrode formed on the organic layer.

The present invention also discloses a method of fabricating an organic light emitting display device including forming a first electrode on a substrate, forming an inorganic pixel defining layer on the substrate having the first electrode, forming an opening in the inorganic pixel defining layer for exposing at least a portion of the first electrode, forming an organic layer having at least an organic emission layer on the exposed first electrode, and forming a second electrode on the organic layer. The inorganic pixel defining layer is formed by an annealing process after applying a solution using a coating method.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
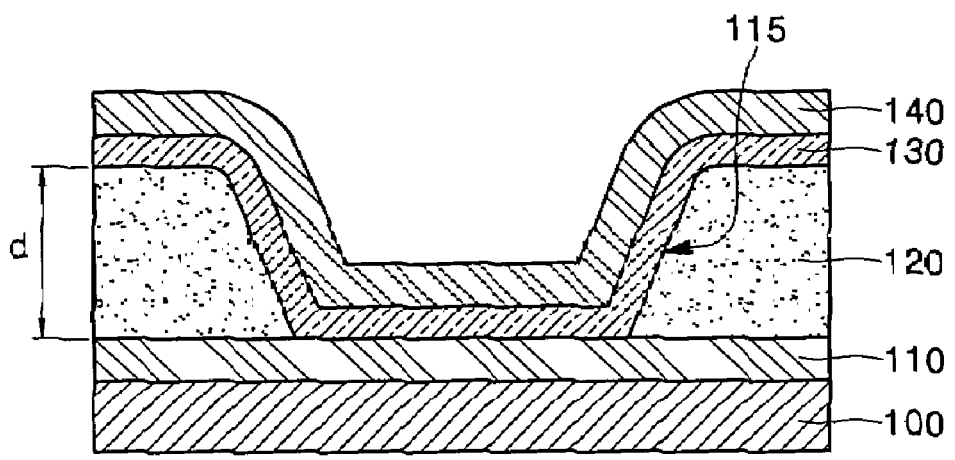
FIG. 1 is a cross-sectional view showing a pixel of a conventional organic light emitting display device.
Figure 2:
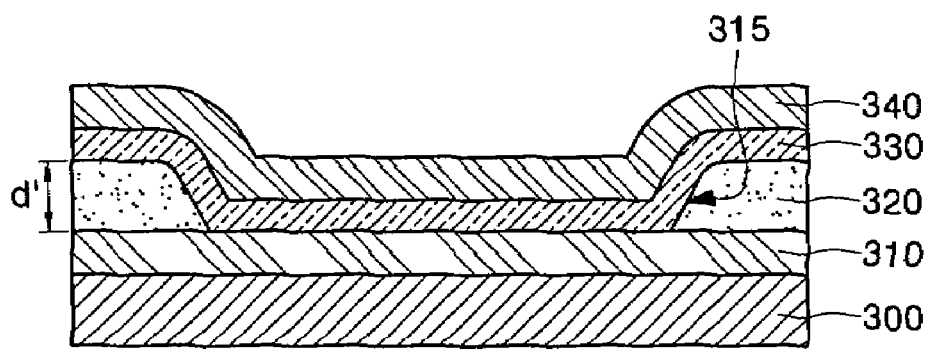
FIG. 2 is a cross-sectional view showing a pixel of an organic light emitting display device according to an embodiment of the present invention.

Referring to FIG. 2, in the OLED according to an embodiment of the present invention, a substrate 300 is provided, and a first electrode 310 is patterned and formed on the substrate 300. The substrate 300 may be a transparent insulating substrate such as glass, plastic, quartz, and so on.

When the first electrode 310 is an anode, it may be a transparent electrode made of ITO or IZO having a high work function, or it may be a reflective electrode including a reflective layer made of a highly reflective metal such as Al, an Al alloy, and so on as its lower layer.

If the first electrode 310 is a cathode, it may be formed of a thin transparent electrode made of one selected from a group consisting of Mg, Ca, Al, Ag, and an alloy thereof as a conductive metal material having a low work function, or it may be made of a thick reflective electrode.

An inorganic pixel defining layer 320 may be formed on the entire surface of the substrate including the first electrode 310. The inorganic pixel defining layer 320 is formed of an inorganic layer in order to prevent pixel shrinkage and decreased lifetime of the OLED, which are caused by deterioration of the organic emission layer due to outgassing of $H_2O$, $O_2$ and so on from the pixel defining layer made of a conventional organic layer. Forming the pixel defining layer of silicon oxide ($SiO_2$) or silicon on glass (SOG) may more effectively prevent outgassing.

In particular, when an organic layer 330 is formed on the inorganic pixel defining layer 320 by a laser induced thermal imaging (LITI) method, the inorganic pixel defining layer 320 may be formed of SOG having a small step formed therein.

When at least one layer of the organic layer 330 is formed using the LITI method, the step formed at a lower part affects transfer characteristics. When a transfer layer receives laser generated heat from a donor substrate including the transfer layer to be transferred to the is substrate 300 of the OLED, if a lower structure has a large step, in particular, if the step is large at an edge portion of the inorganic pixel defining layer 320, the transfer layer, which is to be transferred, may be broken, which exposes the lower structure. Consequently, the first electrode 310 (a lower electrode) and a second electrode (upper electrode), which is formed after the organic layer 330, may contact each other, thereby generating a short circuit.

Therefore, since the inorganic pixel defining layer 320 should have a small step, forming the inorganic pixel defining layer 320 of the SOG makes it possible to maintain the small step. Here, the step should be about 500 nm high or less, preferably 200 nm.

The inorganic pixel defining layer 320 includes an opening 315 for exposing at least a portion of an upper surface of the first electrode 310.

The inorganic pixel defining layer 320 may have a thickness d' of about 1,000 to about 10,000 Å in order to function as an insulating layer separating a pixel region and to prevent cracks from generating due to stress during the annealing process. As a result, when the organic layer 330 is subsequently deposited on the first electrode 310 using the LITI method, it is possible to prevent the organic layer from breaking because the organic layer typically broke due to a step generated by the 1 to 2 µm thick conventional pixel defining layer. Further, adhesion between the first electrode and the organic layer may be improved. At this time, the pixel defining layer 320 allows a greater portion of the first electrode 310 to be exposed, thereby increasing an aperture ratio of the OLED.

An organic layer 330, including at least an organic emission layer, is formed on the first electrode 310 through the opening 315. The organic layer may further include at least one of a hole injection layer, a hole transport layer, a hole blocking layer, an electron transport layer and an electron injection layer in addition to the organic emission layer.

A second electrode 340 is formed on the organic layer 330.

The second electrode 340 may be a reflective electrode made of one selected from a group consisting of Mg, Ca, Al, Ag and an alloy thereof, as a conductive metal material having a low work function, when the first electrode 310 is a transparent anode or a transparent electrode including a reflective layer, and may be formed of a transparent electrode such as ITO or IZO when the first electrode 310 is a cathode.

Hereinafter, a method of fabricating an organic light emitting display device will be described.

Referring to FIG. 2, a substrate 300 is provided. The substrate 300 may be a transparent insulating substrate such as glass, plastic, quartz and so on.

Next, a first electrode 310 is formed on the substrate 300.

The first electrode 310 may be deposited by a sputtering or ion plating method. For example, the first electrode 310 is formed by depositing using a sputtering method and then selectively patterned through a wet etching method using a photoresist (PR), patterned during a photograph process, as a mask.

An inorganic pixel defining layer 320 may be formed on the entire surface of the substrate including the first electrode 310. The inorganic pixel defining layer 320 is formed of an inorganic material as an inorganic insulating layer for defining a unit pixel region. For example, the inorganic pixel defining layer 320 may be formed of $SiO_2$ or SOG.

In an embodiment of the present invention, the inorganic pixel defining layer 320 is formed of a solution of methyl siloxane 10 wt %~20 wt % dissolved in propylene glycol monomethyl ether acetate (PGMEA) solvent or a solution of hydrogen silsesquioxane (HSQ) 5 wt %~35 wt % dissolved in PGMEA solvent.

The inorganic pixel defining layer 320 may be formed on the substrate through a high temperature annealing process after coating the solution on the first electrode 310.

For example, the inorganic pixel defining layer 320 may be formed by applying the solution on the substrate using a spin coating method. A lower step of the substrate is compensated by the applied solution.

The solution applied on the substrate forms a substantially uniform layer having a thickness of about 1,000 to about 10,000 Å by operating a coating apparatus for about 1 to about 30 seconds at a spin speed of about 100 to about 1300 rpm.

Since the pixel defining layer 320 may be about 20,000 Å thick or more when the spin speed of the coating apparatus is 1 second or more at 100 rpm or less, and the pixel defining layer 320 may be about 1,000 Å thick or less when the spin speed is 30 seconds or less at 1300 rpm or more, preferably, the spin speed should be maintained at about 100 to about 1300 rpm for about 1 to about 30 seconds.

The solution applied on the substrate is annealed at a temperature of about 200 to about 300° C. for about ½ hour to about 1 hour.

The layer formed of the solution may be cured at temperatures of 200° C. and above, but a temperature greater than 300° C. exceeds a glass transition temperature of the substrate. Hence, the annealing temperature should maintain a range of about 200 to about 300° C.

Since the layer is insufficiently formed when the annealing process is ½ hour or less, and the layer is sufficiently formed by about 1 hour, preferably, the annealing process should be performed for about ½ hour to about 1 hour.

$H_2O$ contained in the applied layer is removed through the high temperature annealing process to finally form the pixel defining layer 320 made of $SiO_2$.

Hereinafter, a reaction mechanism that the inorganic pixel defining layer is formed of $SiO_2$ will be described.

Table 1 represents physical/chemical variations for understanding of an $SiO_2$ forming mechanism.

TABLE 1

| Symbol | Title | Reaction formula |
|---|---|---|
| A | Hydrolysis | $\equiv$Si—OE + $H_2O$ → $\equiv$Si—OH |
| B | Condensation | $\equiv$Si—OH + HO—Si$\equiv$ → $\equiv$Si—O—Si |
| C | Condensation | $\equiv$Si—OEt + HO—Si$\equiv$ → $\equiv$Si—O—Si |
| D | Decomposition | $\equiv$Si—OEt → $\equiv$Si—OH |
| E | Evaporation | |
| F | Dehydration | |
| G | Viscous sintering | |

TABLE 2

Table 2 represents an $SiO_2$ forming reaction mechanism.

```
                                                          B_y F_y G
                                                          density
                                                          ─────
                                                          SiO2
                                                                    ~900° C.
                                                            ~425° C.
                                                            [Si(OH)_x O_y] =
                                      B_y C_y E     ~250° C.   x → 0
                                      annealing                 y → 2
                                                               (H2O trace)
                         A_y B_y E
  SOG
  substrate  ───→       spin              [Si(Oet)_a(OH)_{b"} O_{c"}]_{n"}
                                              a" < a'
  [Si(Oet)_a(OH)_b O_c]_n   [Si(OEt)a(OH)_b O_c]_n      b" < b'
  c = 1/2(2(4-a-b))         a' < a                     c" > c'
  PGMEA                     b' < b                     n° → ∞
  H_2O                      c' > c
                            n' > n             alcohol } hydrogen bond
                            PGMEA              H2O     ] hydrogen bond
                            H2O

I                 II                III              IV           V
```

Referring to Table 2, the reaction mechanism will be described in steps I through V.

Step I—solution of methyl siloxane 10~20 wt % dissolved in PGMEA solvent or solution of HSQ 5~35 wt % dissolved in PGMEA solvent is prepared.

In this process, [Si(Oet)a(OH)bOc]n, solvent (PGMEA), and $H_2O$ are prepared.

Where, c=½(4−a−b) (a, b, c, n are integers).

Step II—the solution in step I is applied on the substrate using a spin coating method.

This process includes A, B and E reactions to generate [Si(OEt)a'(OH)b'Oc']n', and solvent (PGMEA) and $H_2O$ exist. At this time, relationships of a'<a, b'<b, c'>c, and n'>n are satisfied (a', b', c', n' are integers).

Step III—a material generated in step II is annealed.

This process includes B, C and E reactions at a temperature of about 250° C. or less to generate [Si(Oet)a"(OH)b"Oc"]n". At this time, relationships of a"<a', b"<b', c">c', and n"→∞ are satisfied, and the generated material contains alcohol, $H_2O$ and hydrogen bond (a', b', c', n' are integers).

Step IV—the material generated in step III generates [Si(OH)xOy]∞ at a temperature of about 425° C. or less.

At this time, x→0, y→2, and trace $H_2O$.

Step V—the material generated in step IV includes B, F and G reactions at a temperature of about 900° C. or less to form $SiO_2$ as a final product of the reaction.

While the reaction mechanism forms the $SiO_2$ layer at a high temperature of about 900° C. or less, the substrate of the present invention has a glass transition temperature Tg of about 250 to about 300° C. Since a low molecular weight material such as aluminum-tris-quinolate (Alq3) used as a material for the organic emission layer has low thermal stability, it is preferable to form the $SiO_2$ layer through the annealing process at a temperature of about 300° C. or less.

As a result of measuring a contact angle of a material generated at a temperature of about 200 to about 300° C. by the reaction mechanism in an embodiment of the present invention, the material has the same contact angle, i.e., 30° as the silicon oxide $SiO_2$ layer generated at the temperature of about 900° C. Therefore, the generated material of the present invention is the substantially the same material as the $SiO_2$ layer.

An inorganic pixel defining layer 320 having an opening 315 for exposing a portion of a surface of the first electrode 310 may be formed by a dry etching process using a photoresist pattern.

Portions of the inorganic pixel defining layer 320 are selectively removed during the etching process, using the photoresist pattern formed by the photograph process, to transfer a pattern designed in a reticle to the substrate. The etching process provides the thin layer with a smooth etching profile. For example, the dry etching process may include performing plasma discharge in a chamber having a certain pressure to decompose the reaction gas into ions, radicals, electrons and so on. At this time, the generated radicals cause chemical reaction to perform etching, i.e., plasma etching. The plasma etching process may use $CF_4$ as an etchant.

After the dry etching process, a photoresist strip process and a cleaning process are performed to remove the photoresist. The photoresist strip process may be performed using a high concentration of alkali solution, and the cleaning process may be performed through plasma treatment.

An organic layer 330, including at least an organic emission layer, is then formed on the entire surface of the substrate including the exposed first electrode 310. The organic layer 330 may be formed by a LITI method when a lower inorganic pixel defining layer 320 is formed of silicon on glass (SOG).

The organic emission layer 330 may be made of a low molecular weight material or a polymer material. For example, the low molecular weight material may be one selected from a group consisting of Alq3, anthracene, cyclopentadiene, BeBp2, Almq, ZnPBO, Balq, DPVBi, BSA-2 and 2PSP.

For example, the polymer material may be one selected from a group consisting of poly(p-phenylenevinylene) (PPV) and its derivatives, polythiophene (PT) and its derivatives, and polyphenylene (PPP) and its derivatives.

The organic layer 330 may be deposited using a vacuum deposition method, a spin coating method, an inkjet printing method, a doctor blade method, a LITI method, and so forth. Additionally, a thinner inorganic pixel defining layer 320 decreases a step between the first electrode 310 and the inorganic pixel defining layer 320, thereby allowing the organic layer 330 to be formed using the LITI method.

Each unit pixel may be individually patterned to form the organic layer 330. The organic layer 330 may be patterned using the LITI method and the vacuum deposition method using a shadow mask.

Next, a second electrode 340 is formed on the entire surface of the organic layer 330. The second electrode 340 may be formed by vacuum deposition.

As described above, when an inorganic layer is used as the pixel defining layer, the inorganic pixel defining layer 320 formed of silicon oxide prevents outgassing of $H_2O$, $O_2$ and so on from the pixel defining layer into the organic layer 330 to prevent the organic layer from deteriorating, thereby improving pixel shrinkage and lifetime of the organic emission layer.

As discussed above, exemplary embodiments of the present invention may improve pixel shrinkage and lifetime of an organic emission layer by forming an inorganic pixel defining layer made of silicon oxide ($SiO_2$) using a coating process and a high temperature annealing process to prevent outgassing of $H_2O$, $O_2$ and so on from the pixel defining layer, thereby preventing the organic emission layer from deteriorating.

Additionally, it is possible to improve an aperture ratio by increasing a pixel opening region through compensation of a lower step using the solution, to prevent the organic layer from being shorted due to the lower step when the organic layer is deposited by the LITI method on the first electrode by forming the inorganic pixel defining layer about 1,000 to about 10,000 Å thick, and to improve adhesion between the first electrode and the organic layer.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
    a substrate;
    a first electrode formed on the substrate;
    an inorganic pixel defining layer formed on the first electrode and having an opening exposing at least a portion of the first electrode;
    an organic layer disposed on the first electrode and having at least an organic emission layer; and
    a second electrode formed on the organic layer,
    wherein the inorganic pixel defining layer has a bottom surface that contacts the first electrode and a top surface that contacts the organic layer, the top surface and the bottom surface being opposite sides of the inorganic pixel defining layer, and
    wherein the inorganic pixel defining layer is 1,000 Å to 10,000 Å thick.

2. The organic light emitting display device of claim 1, wherein the inorganic pixel defining layer is a silicon oxide ($SiO_2$) layer.

3. The organic light emitting display device of claim 1, wherein the organic layer is disposed on the exposed portion of first electrode.

4. The organic light emitting display device of claim 1,
    wherein the inorganic pixel defining layer is formed of silicon on glass (SOG), and
    wherein the organic emission layer is formed by a laser induced thermal imaging method.

5. The organic light emitting display device of claim 4, wherein the organic layer is disposed on the exposed portion of the first electrode.

6. The organic light emitting display device of claim 1, wherein the inorganic pixel defining layer consists of a single layer.

7. The organic light emitting display device of claim 1, wherein a first portion of a bottom surface of the organic layer contacts a top surface of the first electrode, and a second portion of the bottom surface of the organic layer that does not contact the top surface of the first electrode is 1,000 Å to 10,000 Å higher than the top surface of the first electrode, the second portion of the bottom surface of the organic layer being the highest point of the bottom surface of the organic layer above the top surface of the first electrode.

* * * * *